United States Patent [19]

Imamura

[11] Patent Number: 4,710,622

[45] Date of Patent: Dec. 1, 1987

[54] DEVICE FOR STABILIZING PHOTOSENSOR OUTPUT TO VARYING TEMPERATURE

[75] Inventor: Tomotsu Imamura, Isehara, Japan

[73] Assignee: Ricoh Company, Ltd., Tokyo, Japan

[21] Appl. No.: 759,320

[22] Filed: Jul. 26, 1985

[30] Foreign Application Priority Data

Jul. 31, 1984 [JP] Japan .................................. 59-161974

[51] Int. Cl.⁴ ............................................ H01V 40/14
[52] U.S. Cl. ............................. 250/214 R; 250/214 C; 323/907
[58] Field of Search ........... 250/214 R, 214 C, 214 A, 250/206, 205, 231 SE, 237 G; 455/618; 323/902, 906, 907; 307/310

[56] References Cited

U.S. PATENT DOCUMENTS

| 3,705,316 | 12/1972 | Burrows et al. | 250/205 |
| 4,313,083 | 1/1982 | Gilbert et al. | 323/907 |
| 4,315,209 | 2/1982 | Schmook | 323/907 |
| 4,328,419 | 5/1982 | Lefebvre | 250/214 C |

Primary Examiner—David C. Nelms
Attorney, Agent, or Firm—Oblon, Fisher, Spivak, McClelland & Maier

[57] ABSTRACT

A device for stabilizing an output of a photosensor which uses a light-emitting element and a light-receiving element is disclosed. A resistor is connected in series with the light-emitting element to control a voltage across the series connection of the light-emitting element and resistor to a constant value. The output of the light-receiving element is stabilized against temperature variations without resorting to an extra light-receiving element for compensation.

7 Claims, 12 Drawing Figures

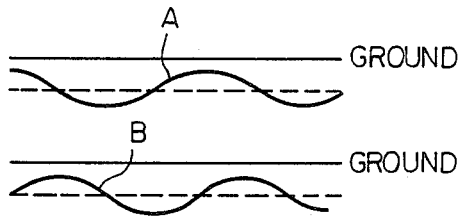
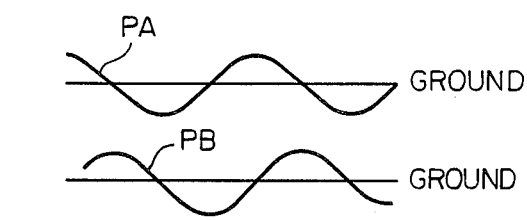
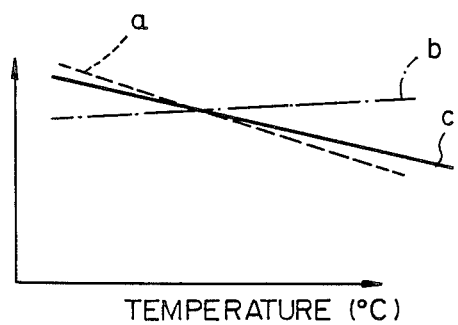
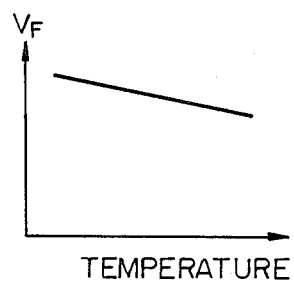
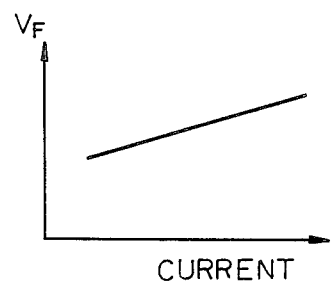

DEVICE FOR STABILIZING PHOTOSENSOR OUTPUT TO VARYING TEMPERATURE

BACKGROUND OF THE INVENTION

1. Field of the Invention

The present invention relates to a device for stabilizing an output of a photosensor which is applicable to a position sensor, light quantity sensor, and other sensors.

2. Description of the Prior Art

A photosensor is generally implemented by a combination of a light-emitting element (e.g. light-emitting diode) and a light-receiving element (e.g. light-receiving diode or phototransistor). Specifically, a light-emitting diode emits light responsive to a current fed thereto, while a light-receiving diode receives the light from the light-emitting diode through a rotatable disk and a mask each of which is formed with a number of slots therethrough. The output of the light-receiving diode is variable depending upon the quantity of light incident thereto. In principle, the output of the light-receiving diode remains constant if the current flowing through the light-emitting diode is maintained constant. In practice, however, it undergoes substantial variations as the ambient temperature changes, even if the current applied to the light-emitting diode is constant. Where such a photosensor is used for any of various kinds of controls, the susceptivity to ambient temperature is apt to result in significant errors in operation and, thereby, makes it difficult to accomplish an accurate control.

SUMMARY OF THE INVENTION

It is therefore an object of the present invention to provide a device which is capable of stabilizing an output of a light-receiving element of a photosensor despite variations in temperature and other ambient conditions.

It is another object of the present invention to provide a device for stabilizing an output of a photosensor which can be implemented with a simple construction and a low cost.

It is another object of the present invention to provide a generally improved device for stabilizing a photosensor output.

A device for stabilizing an output of a photosensor which includes a light-emitting element supplied with a current from a power source for emitting light and a light-receiving element for generating an output responsive to the light incident thereto from the light-emitting element of the present invention comprises a resistor connected in series with the light-emitting element, and voltage control elements for stabilizing the output of the light-receiving element by maintaining a voltage across the serial connection of the light-emitting element and resistor constant.

In accordance with the present invention, a device for stabilizing an output of a photosensor which uses a light-emitting element and a light-receiving element is disclosed. A resistor is connected in series with the light-emitting element to control a voltage across the series connection of the light-emitting element and resistor to a constant value. The output of the light-receiving element is stabilized against temperature variations without resorting to an extra light-receiving element for compensation.

The above and other objects, features and advantages of the present disclosure will become more apparent from the following detailed description taken with the accompanying drawings.

BRIEF DESCRIPTION OF THE DRAWINGS

FIGS. 3A, 3B, 3C and 3D are waveforms representative of output signals of the photosensor;

FIGS. 5A, 5B and 5C are plots representative of the principle of the present invention.

DESCRIPTION OF THE PREFERRED EMBODIMENT

While the device for stabilizing photosensor output of the present invention is susceptible of numerous physical embodiments, depending upon the environment and requirements of use, a substantial number of the herein shown and described embodiment have been made, tested and used, and all have performed in an eminently satisfactory manner.

Figure 1:
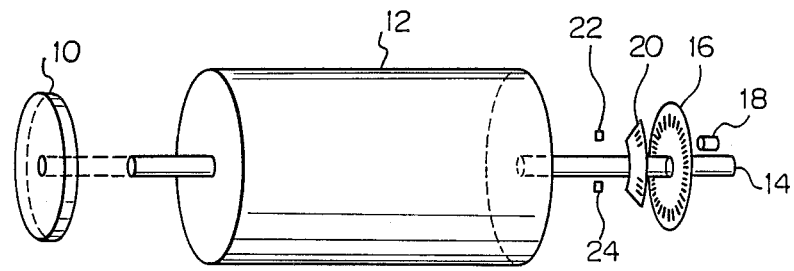
FIG. 1 is a view of a photosensor to which the present invention is applicable, the photosensor serving as a position sensor by way of example.

Referring to FIG. 1, a sensor responsive to a position of a rotary body and using a photosensor to which the present invention pertains is shown. A photosensor usually comprises a light-emitting element such as a light-emitting diode and a light-receiving element such as a light-receiving diode or a phototransistor. In FIG. 1, a load 10 is rotated by a motor 12. A disk 16 is rigidly mounted on an output shaft 14 of the motor 12. A light-emitting diode 18 is located at one side of the disk 16 and a mask 20 at the other side of the disk 16. Light-receiving diodes 22 and 24 are disposed at the rear of the mask 20, that is, between the mask 20 and the motor 12. While the disk 16 is rotatable integrally with the output shaft 14 of the motor 12, the light-receiving diodes 22 and 24, mask 20 and light-emitting diode 18 are fixed to a flanged end of the motor 12 to remain stationary despite the rotation of the shaft 14.

Figure 2A:
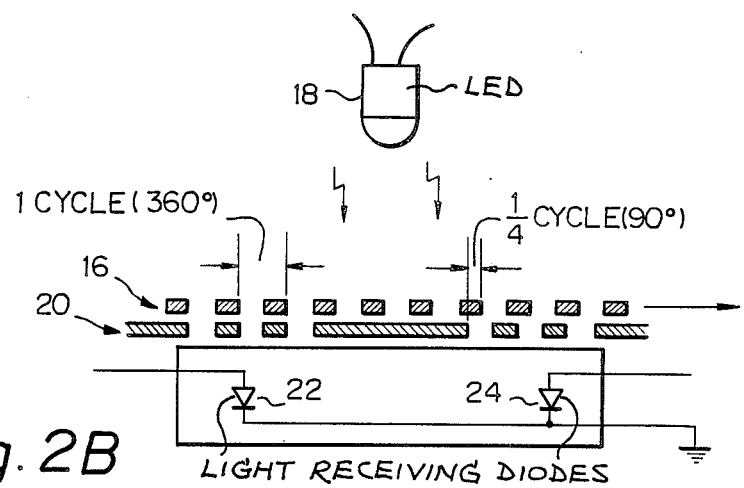
FIGS. 2A, 2B and 2C are detailed views of essential parts of the photosensor shown in FIG. 1.
Figure 2B:
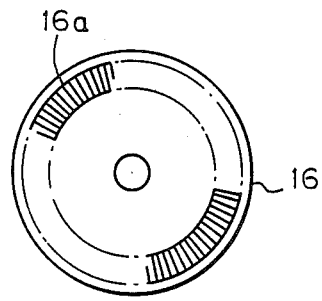
Figure 2C:
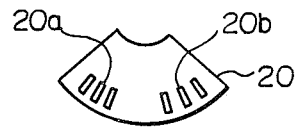

Referring to FIGS. 2A-2C, the light-receiving diodes 22 and 24, mask 20, disk 16 and light-emitting diode 18 are shown in detail. The light-receiving diodes 22 and 24 are provided in a monolithic configuration on a single substrate. The disk 16 is provided with slots 16a at equally spaced locations along the circumference thereof (see FIG. 2B). The mask 20 is also provided with slots 20a and 20b which are identical in shape with the slots 16a of the disk 16 (see FIG. 2C). The slots 20a and 20b are mechanically deviated 90 degrees in phase from each other so that the output signals of the light-receiving diodes 22 and 24 may be deviated 90 degrees in phase. In this construction, as the disk 16 is rotated as indicated by an arrow (see FIG. 2A), the light-receiving diodes 22 and 24 produce outputs which, as represented respectively by waveforms A and B in FIGS. 3A and 3B, are different in phase by 90 degrees from each other. By extracting DC components of the output waveforms A and B of the diodes 22 and 24, there are provided position signals PA and PB as shown in FIGS. 3C and 3D, respectively.

Now, where the outputs A and B of the light-receiving diodes 22 and 24 are measured by varying the ambient temperature while maintaining the current flowing through the light-emitting diode 18 constant, they show an approximately 40% of fluctuation responsive to a temperature change of 50° C. In a positioning device for a servo control, for example, the position signals PA and PB which are 90 degrees different in phase from each other are individually inverted to provide signals having four different phases which are individually differentiated to provide an actual velocity signal, so that the fluctuation in the outputs of the light-receiving diodes 22 and 24 unavoidably appears as velocity errors. In an implementation heretofore proposed against such an occurrence, an extra light-receiving diode which is common in characteristic to the diodes 22 and 24 is used in addition to the light-receiving diodes 22 and 24 and arranged to constantly receive light which issues from the light-emitting diode 18 or another light-emitting diode which may be connected in series with the diode 18; the current flowing through the light-emitting diode 18 is controlled responsive to fluctuation in the output of the extra, or compensation, diode to stabilize the outputs of the position sensing diodes 22 and 24 against varying temperature and voltage. Such a scheme is disclosed in U.S. Pat. No. 4,118,129, for example. However, just as it solves the fluctuation problem, it brings about another problem that the extra light-receiving diode for compensation has to be equipped with at the sacrifice of cost.

Figure 4:
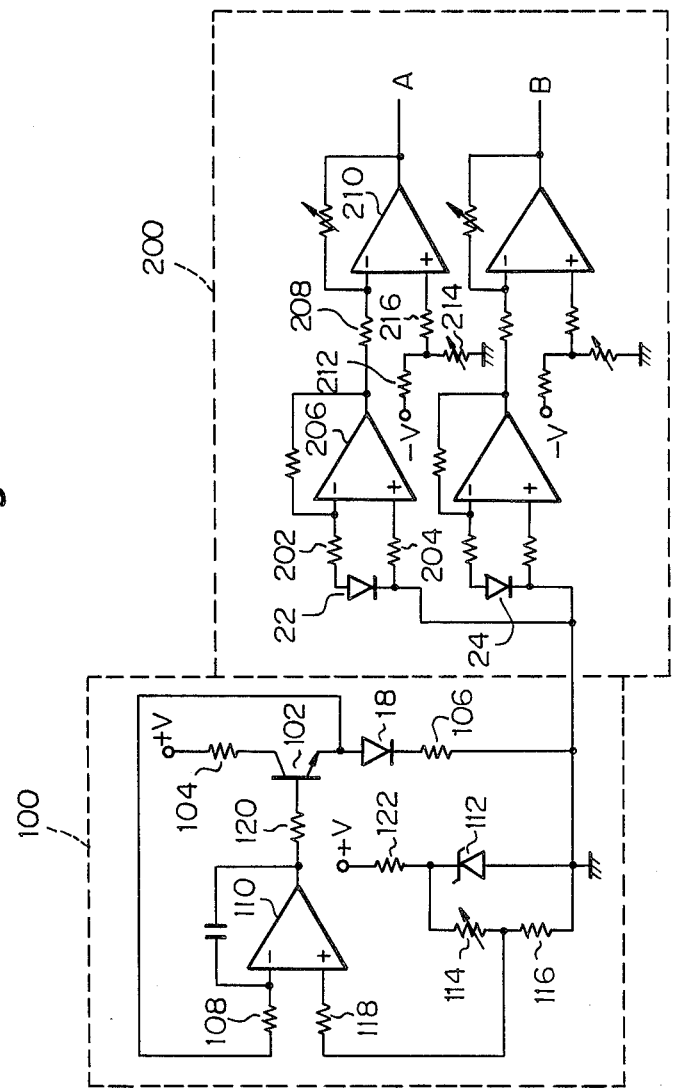
FIG. 4 is a circuit diagram of a photosensor output stabilizing device embodying the present invention.

Referring to FIG. 4, a photosensor output stabilizing device embodying the present invention is shown in a circuit diagram. In this particular embodiment, the device generally comprises a sensor output stabilizing circuit 100 and a sensor signal amplifying circuit 200. Light-receiving diodes 22 and 24 and a light-emitting diode 18 may be arranged in the specific relation which is shown in FIG. 1. The diode 18 has an anode connecting to a power source (+V) via a transistor 102 and a resistor 104, and a cathode connecting to ground via a resistor 106. The terminal voltage $V_F$ of the diode 18 and the drop voltage $V_R$ of a resistor 106 are applied to one input terminal of an operational amplifier (op amp) 110 via a resistor 108. A constant voltage $V_Z$ provided by dividing a Zener voltage of a Zener diode 112 by resistors 114 and 116 is applied via a resistor 118 to the other input terminal of the op amp 110. The op amp 110 functions to control the base current of the transistor 102 via a resistor 120 such that a relation $V_F + V_R = V_Z$ holds between the voltages. That is, the sensor output stabilizing circuit 100 serves to maintain the voltage $V_F + V_R$ across the serial connection of the diode 18 and resistor 106 at $V_Z$ with no regard to the current flowing through the diode 18, ambient temperature, etc. The voltage $V_Z$ is generated by the Zener diode 112 and resistors 122, 114 and 116 and may be controlled to a desired value by controlling the resistor 114.

The current flowing through the light-receiving diode 22 is amplified by an op amp 206 via resistor 202 and 204. As shown in FIG. 3A, the output waveform of the op amp 206 substantially resembles a sinusoidal waveform in the negative range with respect to ground level. The output of the op amp 206 is applied to one input terminal of an op amp 210 via a resistor 208. A voltage provided by dividing a voltage of a negative power source (−V) by resistors 212 and 214 is applied to the other input terminal of the op amp 210 via a resistor 216. The division resistance provided by the resistors 212 and 214 is set at the bias point of 3A, so that the output waveform of the op amp 210 appears as represented by PA in FIG. 3C. This is also true with the arrangement which is associated with the other light-receiving diode 24.

Why the outputs of the light-receiving diodes 22 and 24 become stable with no regard to the temperature and current of the light-emitting diode 18 if the voltage $V_F + V_R$ across the diode 18 and resistor 106 is maintained constant will be described hereinafter.

Referring to FIG. 5A, as the temperature varies, the quantity of light issuing from the light-emitting diode 18 while the current supplied thereto is constant is varied as represented by a line a, the output of a light-receiving diode while the quantity of light incident thereto is constant is varied as represented by a line b, and the output of the light-receiving diode while the current supplied to the diode 18 is constant is varied as represented by a line c. These lines a-c imply that if the sensor stabilizing circuit 100 is absent, the output of a light-receiving diode decreases with the rise of temperature even through the current flowing through the diode 18 is maintained constant. Likewise, a line shown in FIG. 5B teaches that where the temperature is elevated with the current through the diode 18 maintained constant, the voltage $V_F$ across the diode 18 drops with the temperature. Further, a line shown in FIG. 5C shows that where the current through the diode 18 is increased with the temperature maintained constant, the voltage $V_F$ rises with the current.

Considering the characteristics shown in FIGS. 5A-5C, it will be concluded that if the voltage $V_F$ across the diode 18 is held constant, the temperature dependency of a light-receiving diode output can be reduced by compensating for the drop of the voltage $V_F$ due to the temperature elevation by an increase in current. In this case, since the light-receiving diode output against temperature characteristic with the supply of a constant current to a light-emitting diode is lower than the light-emitting diode current against temperature characteristic with the constant $V_F$, the output of the light-receiving diode shows a tendency to slightly increase with the elevation of temperature. In this respect, the resistor 106 is connected in series with the light-emitting diode 18 to suppress the increase in current and, thereby, stabilize the output of the light-receiving diodes 22 and 24.

In the illustrative embodiment, the light-emitting element is implemented by a light-emitting diode an the light-receiving element by a light-receiving diode. It should be noted, however, that such is only illustrative and may be replaced with any other suitable implementations.

In summary, it will be seen that the present invention provides a photosensor output stabilizing device which stabilizes an output of a light-receiving element against temperature and other ambient conditions without resorting to any extra light-receiving element for compensation, thereby accomplishing a simple and cost-effective construction.

Various modifications will become possible for those skilled in the art after receiving the teachings of the present disclosure without departing from the scope thereof.

What is claimed is:

1. A device for stabilizing an output of a photosensor which includes a light-emitting element supplied with a current from a power source for emitting light and a light-receiving element for generating an output responsive to the light incident thereto from the light-emitting element, said device comprising:

resistor means connected in series with said light-emitting element; and voltage control means which maintains a constant voltage across the series connected light-emitting element and said resistor means whereby the output of said light-receiving means is substantially constant over a wide temperature range.

2. A device as claimed in claim 1, wherein the light-emitting element comprises a light-emitting diode.

3. A device as claimed in claim 1, wherein the light-receiving element comprises a light-receiving diode.

4. A device as claimed in claim 1, wherein the voltage control means comprises constant voltage generator means connected to the power source for generating a predetermined voltage and voltage setting means for equalizing the voltage across the light-emitting element and the resistor means to the predetermined voltage outputted from said constant voltage generator means.

5. A device as claimed in claim 4, wherein the constant voltage generator means comprises a Zener diode connected to the power source for generating a Zener voltage and a series connection of two resistors connected in parallel with said Zener diode for generating the constant voltage at a junction of the two resistors by dividing the Zener voltage.

6. A device as claimed in claim 5, wherein one of the two resistors comprises a variable resistor.

7. A device as claimed in claim 4, wherein the voltage setting means comprises a transistor connected between the power source and the light-emitting element and an operational amplifier for producing an output for controlling a base current of said transistor responsive to said predetermined voltage and said constant voltge across the light-emitting element and the resistor means.

* * * * *

UNITED STATES PATENT AND TRADEMARK OFFICE
CERTIFICATE OF CORRECTION

PATENT NO. : 4,710,622

DATED : 12/01/87

INVENTOR(S) : Tomoatsu Imamura

It is certified that error appears in the above-identified patent and that said Letters Patent is hereby corrected as shown below:

On the Title Page, Item [75]

--The Inventors name has been incorrectly recorded. It Should read:

Tomoatsu Imamura, Isehara, Japan.--

Signed and Sealed this

Twenty-sixth Day of July, 1988

Attest:

DONALD J. QUIGG

*Attesting Officer*  *Commissioner of Patents and Trademarks*